United States Patent [19]

Kouzai et al.

[11] Patent Number: 4,511,890
[45] Date of Patent: Apr. 16, 1985

[54] ENERGIZATION INDICATOR FOR TIME SWITCH

[75] Inventors: Fumio Kouzai; Yoshiaki Motoki, both of Hiroshima, Japan

[73] Assignee: Mitsubishi Denki Kabushiki Kaisha, Tokyo, Japan

[21] Appl. No.: 368,506

[22] Filed: Apr. 15, 1982

[30] Foreign Application Priority Data

Apr. 16, 1981 [JP] Japan .................. 56-58201

[51] Int. Cl.³ ............................................ G08B 21/00
[52] U.S. Cl. .................... 340/644; 307/130; 307/285; 340/660
[58] Field of Search ............ 340/815.03, 870.27, 340/870.39, 644, 660, 662, 663; 307/130, 75, 285; 200/38 DA; 324/115

[56] References Cited

U.S. PATENT DOCUMENTS 2,807,766  9/1957  Moody et al. .................... 307/75 X
3,465,208  9/1969  Patrickson et al. ............. 307/130 X
3,581,029  5/1971  Noiles ............................ 200/38 DA
3,873,979  3/1975  Craford et al. ................. 340/815.03

OTHER PUBLICATIONS

Advertising Brochure, Paragon 24 Hour Time Controls Bulletin 2100, Copyright AMF Paragon Apr. 1973.
Advertising Brochure, Sunao Calendar Timer (Japan).

Primary Examiner—Jerry W. Myracle
Attorney, Agent, or Firm—Bernard, Rothwell & Brown

[57] ABSTRACT

An energization indicator lamp for time switch in which a two-color light emission element which can be switched from either color to the other color is used in place of a conventional energization indicator lamp, and a color of light emitted from the two-color light emission element is automatically switched in response to supply voltage, whereby the presence of energization upon the time switch as well as a value of the supply voltage can easily and correctly be recognized.

4 Claims, 5 Drawing Figures

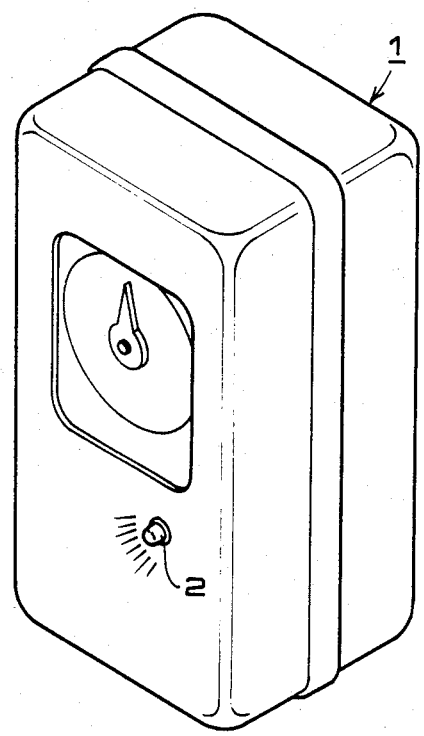
F I G. 1

ENERGIZATION INDICATOR FOR TIME SWITCH

BACKGROUND OF THE INVENTION

1. Field of the Invention

This invention relates to an energization indicator for time switch, and particularly to an improvement for an indicator indicating a supply state of electric power in an electric time switch for switching the same on or off by receiving the supply of electric power from the outside of the time switch.

2. Description of the Prior Art

In order to normally operate such a type of electric time switch (hereinafter referred to simply as "time switch"), it is required that appropriate electric power is supplied to the time switch. Furthermore it is desired to easily discriminate whether the time switch is energized or not at the time of operating the connection of load, or of setting the time to be switched. For this reason, an energization indicator lamp 2 is generally utilized in a time switch 1 as shown in FIG. 1.

Heretofore circuits shown in FIGS. 2 and 3 have been proposed as energization indicating circuits for such type of indicator as stated above.

Namely, FIG. 2 shows an example in which a neon lamp 2a is used as such energization indicator lamp. In the circuit shown in FIG. 2, a current limitation resistance 3 is connected to the neon lamp 2a, and further a motor driving circuit part 4 is connected with these resistance 3 and circuit part 4 in parallel. In this arrangement, a driving motor 8 for the time switch is driven by means of the circuit part 4.

Moreover FIG. 3 shows another example in which a light emission diode 2b is utilized as the energization indicator lamp. In the circuit shown in FIG. 3, a circuit 5 for dropping, rectifying and smoothing voltage (or dropping, rectifying and smoothing circuit) for commercial power source is connected with a current limitation resistance 3 and a light emission diode 2b in parallel on the input side thereof. In this arrangement, the output of the smoothing circuit 5 supplies electric power to a motor driving circuit part 4 and at the same time, supplies the electric power to the light emission diode 2b through the current limitation resistance 3 so that it causes the light emission diode 2b to emit light.

In the conventional examples as shown in FIGS. 2 and 3, if electric power is supplied to the time switch 1, the energization indicator lamp 2 remains lit. By such lighting, it is indicated that the time switch 1 is normally operated.

However a conventional energization indicator lamp 2 has a disadvantage as mentioned below, because the lamp indicates only the presence of power supply upon the time switch 1. For instance, in the case where a 100 V–200 V common time switch is employed, it is impossible to discriminate whether the voltage now applied is 100 V or not, but 200 V. In these circumstances, a label indicating the applied voltage has heretofore been stuck on a time switch in a suitable manner in order to discriminate the voltage applied. Therefore a troublesome operation such as renewal of the label has been required in the case where there is a change in the provision of the time switch so that the voltage supplied thereto also changes. Besides there is a danger for causing accidents due to mistakes such as missing of such label on the time switch, and erroneous application of a label thereon.

SUMMARY OF THE INVENTION

It is an object of the present invention to provide a time switch provided with an energization indicator lamp by which disadvantages of the conventional energization indicator lamps as mentioned above can be eliminated. Such object of the present invention is attained by the provision of the energization indicator lamp in which an indication element which can be switched from either color to the other is used as the energization indicator lamp 2, and a color of light emitted is automatically switched in response to supply voltage, whereby the presence of energization upon the time switch as well as a value of the supply voltage can easily and correctly be recognized.

The other objects and characteristic features of the present invention will be more clearly understood from the following detailed description of an embodiment by referring to the accompanying drawings.

BRIEF DESCRIPTION OF THE DRAWINGS

FIG. 1 is a perspective view showing an outline of a time switch provided with an energization indicator lamp;

PREFERRED EMBODIMENT OF THIS INVENTION

Figure 2:
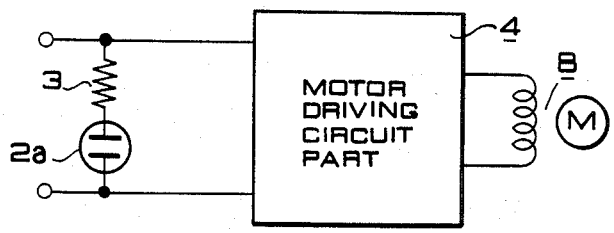
FIGS. 2 and 3 are circuit diagrams each showing a conventional energization indicator lamp.
Figure 3:
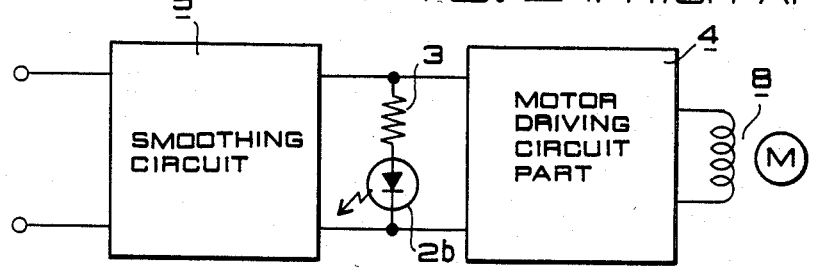
Figure 4:
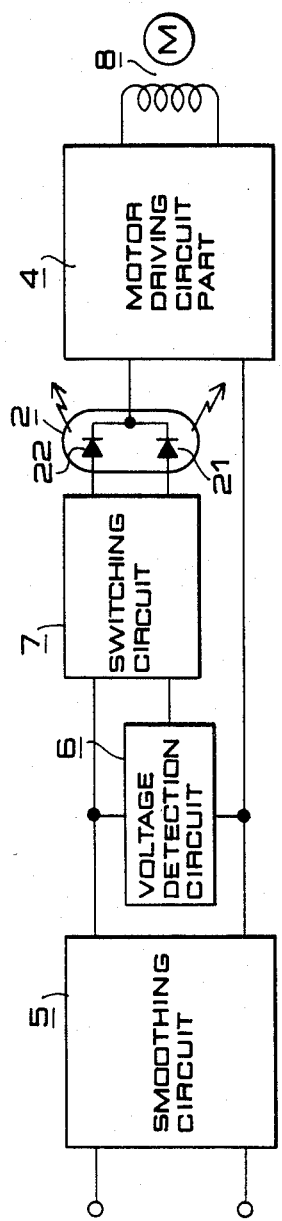
FIG. 4 is a block diagram showing an embodiment of time switch circuit according to the present invention.
Figure 5:
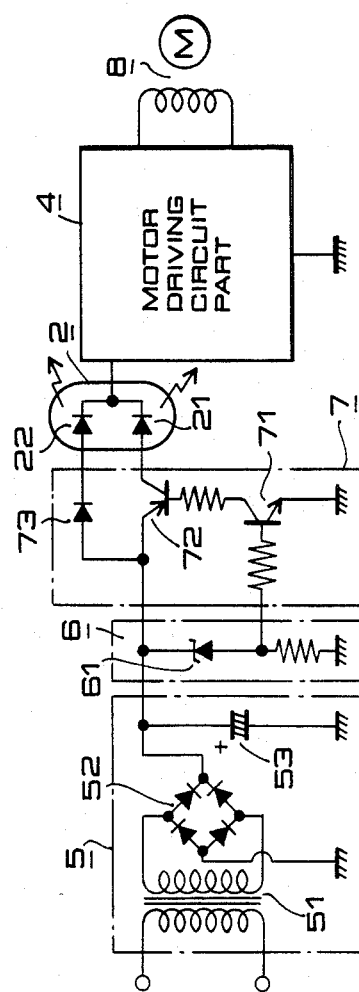
FIG. 5 is a specific circuit diagram of FIG. 4.

A preferred embodiment of this invention will now be described hereinbelow by referring to FIGS. 4 and 5, respectively, wherein the identical reference numerals designate the corresponding parts to those of FIGS. 1–3, respectively. A voltage detection circuit 6 is connected with the output side of a circuit 5 for dropping, rectifying and smoothing voltage (or dropping, rectifying and smoothing circuit) for commercial power source in parallel thereto. Output of the voltage detection circuit 6 is supplied to a switching circuit 7. An energization indicator lamp 2 is connected to the output side of the switching circuit 7. The energization indicator lamp 2 consists of a two-color light emission diode fabricated through integration of a red light emission diode 21 and a green light emission diode 22 by means of cathode common manner. A motor driving circuit part 4 comprises an oscillation circuit, dividing circuit, output amplifier circuit, battery charging circuit for compensating power off and the like being not shown, respectively, and it is arranged by the motor driving circuit part 4 in such that a constant voltage is applied to a driving motor 8 for time switch irrespective of supply voltage. Further the aforesaid dropping, rectifying and smoothing circuit 5 comprises, as shown in FIG. 5, a dropping transformer 51, a rectifier bridge 52 and an electrolytic condenser 53. In addition, the voltage detection circuit 6 comprises a Zener diode 61. Besides the switching circuit 7 comprises transistors 71 and 72 as well as another diode 73.

Next, operations of the above stated circuits will be described hereinbelow. The voltage dropped by means of the transformer 51 is rectified and smoothed by means of the rectifier bridge 42 and the electrolytic condenser 53 to become dc voltage. The resulting dc voltage is supplied to cathode terminal of the Zener diode 61 in the detection circuit 6. Meanwhile the sum of Zener voltage $V_Z$ in the Zener diode 61 and voltage $V_{BE}$ across the base and emitter of the transistor 71 is set to a substantially intermediate value between the output voltage in the case when supply voltage upon the time switch is 100 V and the output voltage in the case when such supply voltage is 200 V. Accordingly when the supply voltage upon the time switch 1 is 100 V, dc output voltage from the dropping, rectifying and smoothing circuit 5 becomes lower than the aforesaid sum voltage $V_Z+V_{BE}$, so that it does not cause the Zener diode 61 to conduct. As a consequence, both the transistors 71 and 72 are OFF so that the electric power from the dropping, rectifying and smoothing circuit 5 is supplied from the diode 73 to the motor driving circuit part 4 through the insulated light emission diode 22. In other words, when such supply voltage is 100 V, the energization indicator lamp 2 emits green light. On the other hand, when the supply voltage upon the time switch 1 is 200 V, the output voltage derived from the dropping, rectifying and smoothing circuit 5 comes to be higher than the aforesaid sum voltage $V_Z+V_{BE}$, so that it causes the Zener diode 61 to conduct. Upon conduction of the aforesaid Zener diode 61, the aforesaid transistors 71 and 72 come to be ON. Meantime, a voltage sum of collector-emitter saturation voltage $V_{CE(Sat)}$ of the aforesaid transistor 72 and forward voltage $V_F$ of the red light emission diode is set at a lower sum voltage than the sum voltage of forward voltage $V_F$ of the diode 73 and forward voltage $V_F$ of the green light emission diode. Consequently, when the aforesaid transistor 72 becomes ON, the electric power from the dropping, rectifying and smoothing circuit 5 is supplied from the above transistor 72 to the motor driving circuit part 4 through the red light emission diode 21. Namely, when such supply voltage is 200 volt, the energization indicator lamp 2 emits red light.

As described above, the present invention is constructed in such that a two-color light emission diode is utilized as the energization indicator lamp 2, and the color of light emission is switched in response to either high or low supply voltage upon the time switch 1. As a result, the presence of energization may be discriminated, besides the difference of voltage energized can easily be confirmed. Accordingly, in accordance with such construction of the present invention, a two-way voltage type time switch having high safety based on which, for example, electric shock accident can be prevented in view of electrical working or operation can be obtained. Furthermore, according to the time switch of the present invention, inoperative accident of a time switch due to turn on mistake of power supply upon the time switch can also be prevented from occuring.

In addition, if the Zener voltage in the Zener diode 61 is selected at a suitable value, it is also possible to check the voltage supplied to the time switch 1 and to easily discriminate whether the voltage supplied to the motor driving circuit part is normal or abnormal.

In the above embodiment, although the reference is made to the case where the two-color light emission diode is utilized, it is to be understood that the present invention can attain similar advantages to those of the embodiment, even if separate light emission diodes each having a different color from one another are independently used.

What is claimed is:
1. An energization indicator for time switch comprising:
   (a) a motor driving circuit for the time switch;
   (b) a dc converting circuit for dropping, rectifying and smoothing voltage of commercial power source and supplying power to said motor driving circuit at either of a plurality of output voltages,
   (c) a voltage detection circuit for detecting the output voltage of said dc converting circuit and generating a signal dependent on which of the output voltages is being supplied by said converting circuit,
   (d) a switching circuit for selectively switching in energization circuit for the output voltage of said dc converting circuit to said motor driving circuit in series with either a first load circuit or a second load circuit in response to the signal from said voltage detection circuit, and
   (e) light emission elements inserted into said first and second load circuits, respectively and emitting different colors from one another to indicate which of said output voltages is being supplied to said motor driving circuit.

2. An energization indicator for time switch as claimed in claim 1 wherein said voltage detection circuit comprises a Zener diode.

3. An energization indicator for time switch as claimed in claim 1 wherein said light emission element is a two-color light emission diode.

4. An energization indicator for time switch as claimed in claim 1 wherein said light emission element consists of separate light emission diodes each having different color from one another.

* * * * *

UNITED STATES PATENT AND TRADEMARK OFFICE
CERTIFICATE OF CORRECTION

PATENT NO. : 4,511,890
DATED : April 16, 1985
INVENTOR(S) : Fumio Kouzai et al.

It is certified that error appears in the above-identified patent and that said Letters Patent is hereby corrected as shown below:

Column 2, line 66, the numeral "42" should be --52--.

Signed and Sealed this

Eighth Day of October 1985

[SEAL]

Attest:

DONALD J. QUIGG

Attesting Officer

Commissioner of Patents and
Trademarks—Designate